United States Patent
Suzuki et al.

(10) Patent No.: US 7,868,456 B2
(45) Date of Patent: Jan. 11, 2011

(54) SEMICONDUCTOR DEVICE AND METHOD FOR FABRICATING THE SAME

(75) Inventors: Takashi Suzuki, Kawasaki (JP); Hideki Kitada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 52 days.

(21) Appl. No.: 12/019,114

(22) Filed: Jan. 24, 2008

(65) Prior Publication Data

US 2008/0211098 A1 Sep. 4, 2008

(30) Foreign Application Priority Data

Feb. 15, 2007 (JP) .............................. 2007-034997

(51) Int. Cl.
  *H01L 23/532* (2006.01)
  *H01L 21/4763* (2006.01)
(52) U.S. Cl. ....................... 257/761; 257/774; 257/776; 257/E23.161; 257/E21.495; 257/E23.01; 438/643; 438/648; 428/209
(58) Field of Classification Search .................... 257/48, 257/751, 774, E23.161, E21.495, E21.585, 257/E23.01, E23.16; 428/209; 438/631, 438/648, 642, 685
See application file for complete search history.

(56) References Cited

U.S. PATENT DOCUMENTS

2003/0118798 A1 6/2003 Fujii

2004/0140569 A1* 7/2004 Meguro et al. .............. 257/776

FOREIGN PATENT DOCUMENTS

| JP | 2000-195822 A | 7/2000 |
| JP | 2003-257979 A | 9/2003 |
| JP | 2005-317835 A | 11/2005 |

OTHER PUBLICATIONS

Japanese Office Action dated Jul. 21, 2009, issued in corresponding Japanese Patent Application No. 2007-034997 (Partial Translation).
Chinese Office Action dated Jul. 10, 2009, issued in corresponding Chinese Patent Application No. 200810008930.

(Continued)

*Primary Examiner*—Sue Purvis
*Assistant Examiner*—Whitney Moore
(74) *Attorney, Agent, or Firm*—Fujitsu Patent Center

(57) ABSTRACT

A semiconductor device in which the resistance of a copper wiring to electromigration is increased. The copper wiring is formed so that copper grains will be comparatively large in a central portion of the copper wiring and so that copper grains will be comparatively small in an upper portion and a lower portion of the metal wiring. The copper wiring having this structure is formed by a damascene method. This structure can be formed by controlling electric current density at electroplating time. With the copper wiring having this structure, it is easier for an electric current to run through the central portion than to run through the upper portion. As a result, the diffusion of copper atoms in the upper portion is suppressed and therefore the diffusion of copper atoms from an interface between the copper wiring and a cap film is suppressed.

4 Claims, 19 Drawing Sheets

OTHER PUBLICATIONS

Japanese Office Action dated Apr. 28, 2009, issued in corresponding Japanese Patent Application No. 2007-034997.

T. Usui et al; "Identifcation of Electromigration Dominant Diffusion Path for Cu damascene interconnects and Effect of Plasma Treatment and Barrier Dielectrics on Electromigration Performance"; Proceedings of the 42nd Annual International Reliability Physics Symposium (IEEE, Phoenix, U.S.A.), pp. 246-250.

M.W. Lane et al; "Relationship between interfacial adhesion and electromigration in Cu metallization"; Journal of Applied Physics, vol. 93, No. 3, pp. 1417-1421.

E. H. Sondheimer; "The Mean Free Path of Electrons in Metals"; Advances in Physics, vol. 1, No. 1, pp. 1-42.

A.F. Mayadas et al; "Electrical-Resistivity Model for Polycrystalline Films: the Case of Arbitrary Reflection at External Surfaces"; Physical Review B, vol. 1, No. 4, pp. 1382-1389.

* cited by examiner

SEMICONDUCTOR DEVICE AND METHOD FOR FABRICATING THE SAME

CROSS-REFERENCE TO RELATED APPLICATIONS

This application is based upon and claims the benefits of priority from the prior Japanese Patent Application No. 2007-034997, filed on Feb. 15, 2007, the entire contents of which are incorporated herein by reference.

BACKGROUND OF THE INVENTION (1) Field of the Invention

This invention relates to a semiconductor device and a method for fabricating the semiconductor device and, more particularly, to a semiconductor device having metal wirings of copper (Cu) or the like and a method for fabricating such a semiconductor device.

(2) Description of the Related Art

With an increase in the integration levels of silicon (Si) semiconductor devices and a reduction in the sizes of chips, wirings formed in these semiconductor devices have become thinner and the number of wiring layers formed in these semiconductor devices has increased. With devices in which a half pitch is 65 nm, for example, the minimum wiring width is about 100 nm. When an electric current is passed through such a thin wiring, metal atoms contained in the wiring may move. This phenomenon is referred to as electromigration. The electromigration causes a void or a hillock in the wiring, resulting in an increase in the resistance of the wiring, the breaking of the wiring, a short circuit, or the like. That is to say, the electromigration deteriorates the reliability of a circuit.

By the way, copper wirings formed by what is called a damascene method are generally used in ultramodern Si semiconductor devices. With the damascene method a copper wiring is formed in the following way. For example, lithography and etching are used first for forming a groove in an insulating film. A barrier metal and a seed copper film are then formed over an entire surface by a sputtering method. A copper film is formed over the barrier metal and the seed copper film by an electroplating method to fill in the groove. An excess copper film and barrier metal over the insulating film are removed by chemical mechanical polishing (CMP). By doing so, a copper wiring is formed. In addition, a cap film of silicon nitride (SiN) or the like is formed on the copper wiring by, for example, a chemical vapor deposition (CVD) method for the purpose of suppressing the diffusion of copper atoms contained in the copper wiring. This is the same with the above barrier metal (see, for example, Japanese Unexamined Patent Publication No. 2005-317835).

The copper wiring formed in this way is enclosed by the barrier metal and the cap film. Adhesion at an interface between the cap film and the copper wiring is poorer than adhesion at an interface between the barrier metal and the copper wiring. The reason for this is as follows. The two metals are joined at the interface between the barrier metal and the copper wiring. On the other hand, the insulating film and the metal are joined at the interface between the cap film and the copper wiring. It is considered that diffusion of copper atoms contained in the copper wiring tends to occur at the interface between the cap film and the copper wiring where adhesion is poor. Really the probability that voids are found here and there at this interface is high.

For example, the following method is proposed as a method for increasing resistance to the electromigration. Before a cap film is formed, predetermined pretreatment is performed. By forming the cap film after the pretreatment, the properties of an interface between the cap film and a copper wiring are changed (see, for example, "Identification of Electromigration Dominant Diffusion Path for Cu Damascene Interconnects and Effect of Plasma Treatment and Barrier Dielectrics on Electromigration Performance", Proceedings of the $42^{nd}$ International Reliability Physics Symposium (IEEE, Phoenix, U.S.A. 2004), pp. 246-250). In addition, the following method is proposed as another method for increasing resistance to the electromigration. A metal such as cobalt tungsten phosphorus (CoWP) is used for forming a cap film (see, for example, Journal of Applied Physics, Vol. 93, No. 3, pp. 1417-1421, (January 2003)).

As generations progress in the future, wiring width becomes narrower. With devices in which a half pitch is 45 nm, the minimum wiring width is about 70 nm. In such a situation, it may be impossible to adequately suppress the electromigration only by taking a material for the cap film into consideration and changing the properties of the interface between the cap film and the copper wiring in the above way. For example, if SiN is used for forming the cap film, adhesion at the interface between the cap film and the copper wiring is good compared with the case where silicon carbide (SiC) or silicon carbide nitride (SiCN) is used forming the cap film. However, the dielectric constant of SiN is higher than that of SiC or SiCN. As a result, forming the cap film by the use of SiN makes high-speed operation of the device impossible.

In addition, if a metal cap film like that described above is used, adhesion at the interface between the cap film and the copper wiring is good and the diffusion of copper atoms can be suppressed. Such a metal cap film must selectively be formed over wirings. However, it is not always easy to selectively form a metal cap film in that way over narrow-pitch wirings in a next generation semiconductor device. Accordingly, under the present situation a problem still exists from the viewpoint of mass production.

SUMMARY OF THE INVENTION

Therefore, one possible object is to provide a semiconductor device including highly reliable metal wirings having resistance to electromigration.

Another possible object is to provide a method for stably fabricating a semiconductor device including highly reliable metal wirings.

In order to achieve the above first object, a semiconductor device including a metal wiring is provided. In this semiconductor device, a top of the metal wiring is covered with a film and resistance of an upper portion of the metal wiring near an interface between the film and the metal wiring is higher than resistance of a central portion of the metal wiring.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 10C is a fragmentary schematic sectional view showing the step of forming a barrier metal and the like.

FIG. 10F is a fragmentary schematic sectional view showing the step of forming a first cap film and the like.

FIG. 10J is a fragmentary schematic sectional view showing the step of forming a second cap film and the like.

DESCRIPTION OF THE PREFERRED EMBODIMENTS

Embodiments of the present invention will now be described in detail with reference to the drawings.

The structure and characteristics of a copper wiring will be described first.

Copper wirings of various shapes are formed first and the resistance of these copper wirings is measured precisely.

Furthermore, the wiring width and wiring height of these copper wirings are measured precisely and resistivity is calculated.

In addition, by changing conditions under which copper films are formed at the time of forming these copper wirings and the wiring width and wiring height of these copper wirings, the grain size of copper grains which make up these copper wirings is changed. The grain size of the copper grains is measured by a transmission electron microscope (TEM) method or an electron back scattering pattern (EBSP) method.

Figure 1:
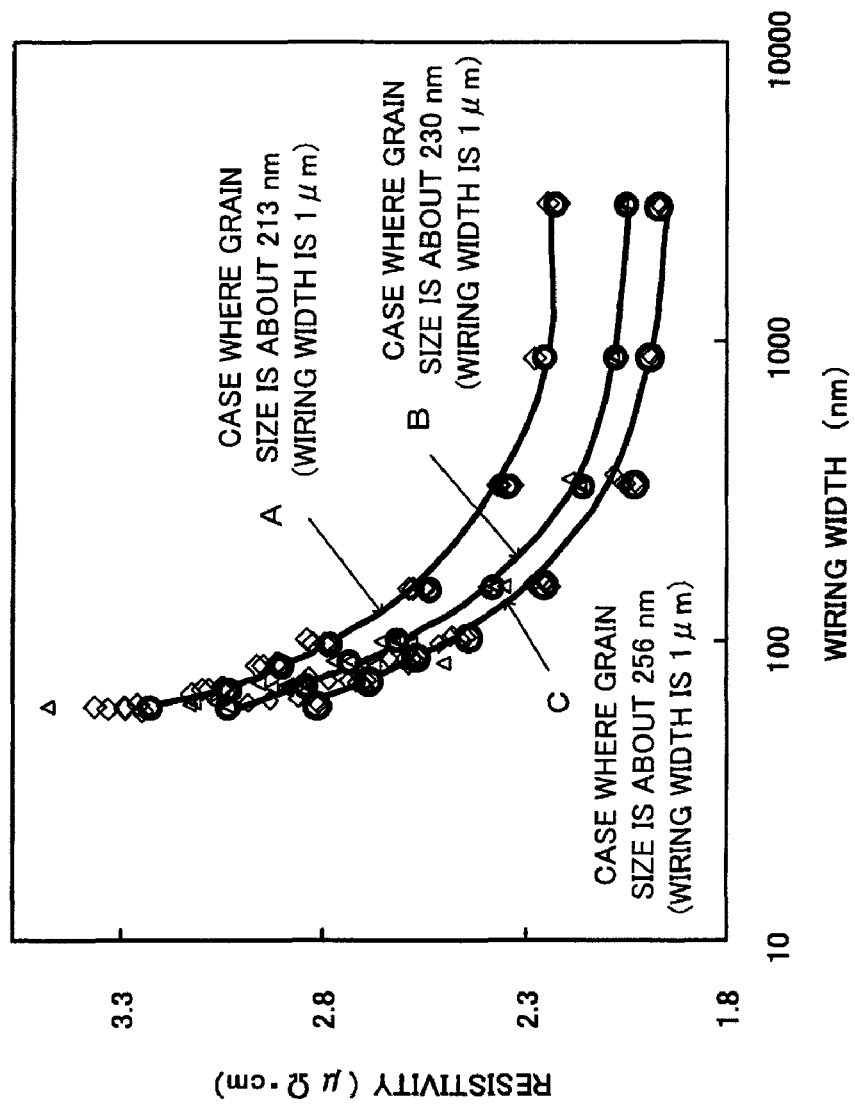
FIG. 1 is a view showing the relationship between the wiring width and resistivity of copper wirings.

FIG. 1 is a view showing the relationship between the wiring width and resistivity of the copper wirings. In FIG. 1, a horizontal axis indicates wiring width (nm) and a vertical axis indicates resistivity ($\mu\Omega\cdot$cm). In addition, fitting curves A, B, and C obtained by performing fitting by the use of models described later are also shown in FIG. 1.

As can be seen from FIG. 1, the resistivity of the copper wirings depends on the grain size of the copper grains which make up the copper wirings. When wiring width is several hundred nm, the resistivity of the copper wirings begins to increase. When wiring width is 100 nm or less, the resistivity of the copper wirings significantly increases. In FIG. 1, three different values (about 213 nm, 230 nm, and 256 nm (wiring width is 1 $\mu$m)) are used as average grain sizes. Even if the wiring width is the same, resistivity becomes higher with a decrease in grain size.

To analyze these results, the fitting is performed about the dependence of resistivity on grain size by the use of a film surface scattering model (F-S Model; E. H. Sondheimer, "The Mean Free Path of Electron in Metals", Adv. Phys. (1952)) and a model in which scattering at grain boundaries is considered (M-S Model; A. F. Mayadas, "Electrical-Resistivity Model for Polycrystalline Films: the Case of Arbitrary Reflection at External Surfaces", Phys. Rev. B (1970), Vol. 1, p. 1382). Of parameters necessary for the fitting, values obtained by really measuring the formed copper wirings are used as grain size. In FIG. 1, the fitting curves A, B, and C are also shown.

When the wiring width of a copper wiring becomes 100 nm or less, the ratio of a surrounding interface to the cross-sectional area of the copper wiring increases and the contribution of electron scattering increases. As a result, the resistivity of the copper wiring increases. As grain size becomes smaller, resistivity increases. If this is also considered correctly, a nearly complete description of a change in resistivity can be given. That is to say, with a very thin wiring the wiring width of which is 100 nm or less, electrons reflect from an interface and the effect of electron scattering is marked at grain boundaries. As a result, resistivity also depends on grain size. This phenomenon becomes significant when grain size becomes about 40 nm which corresponds to the scattering free path of an electron.

On the basis of this result the following conclusion is derived. For example, if grain size distribution exists in a very thin wiring, an electric current selectively runs through areas in which grain size is comparatively large. The reason for this is that electricity tends to pass through areas the resistance of which is low.

Figure 2:
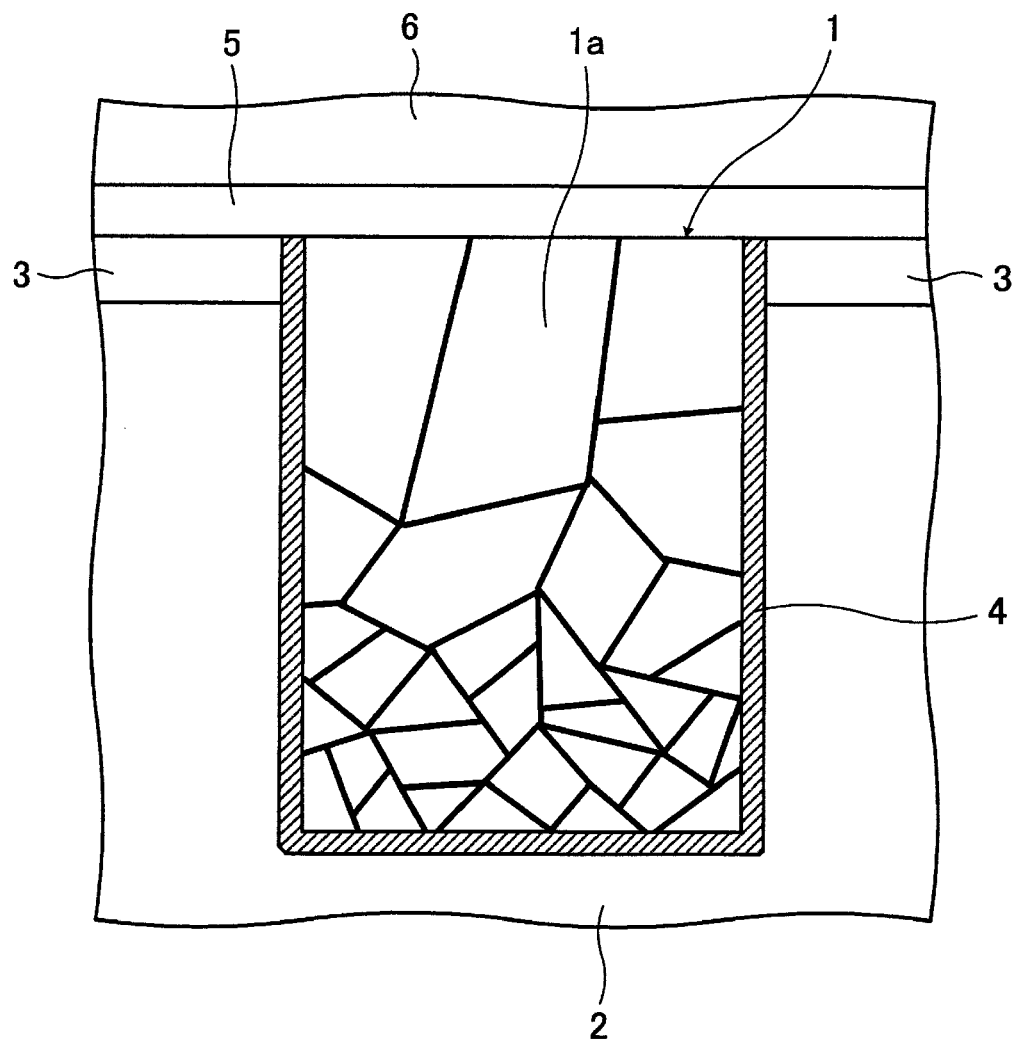
FIG. 2 is a view for describing grain size distribution in a copper wiring.

FIG. 2 is a view for describing grain size distribution in a copper wiring.

To form a copper wiring 1 by the damascene method, a hard mask 3 of SiN or the like is formed first over an interlayer dielectric 2 of silicon oxide ($SiO_2$) or the like. A groove is formed in an area where the copper wiring 1 is to be formed. A refractory metal such as tantalum (Ta), titanium (Ti), or tantalum nitride (TaN) is used for forming a barrier metal 4 over an entire surface by the sputtering method. A seed copper film (not shown) is then formed. A copper film is formed over the seed copper film by electroplating. By doing so, the groove is filled in. By removing an excess copper film and barrier metal 4, for example, over the hard mask 3 by the CMP, the copper wiring 1 is formed. A cap film 5 of SiC, SiN, or the like is formed over the copper wiring 1 by, for example, the CVD method. Furthermore, an upper-layer interlayer dielectric 6 of $SiO_2$ or the like is formed over the cap film 5.

With this method usually the rate at which the copper film is formed is made slow in the beginning stage of the electroplating by lowering current density. This operation is performed so that the copper film will be embedded reliably in a lower portion and lower sidewall portions of the copper wiring 1 regardless of the wiring width of the copper wiring 1 and so that the seed copper film will not melt because of a rapid change in current at the time of beginning the electroplating. The formed copper film takes in a large number of impurities in the beginning stage of the electroplating in which current density is low and in which the copper film is formed at a slow rate. As a result, when heat treatment is performed later, many copper grains 1a are formed with the many impurities as nuclei. In other words, the many impurities prevent large copper grains 1a from being formed. Accordingly, the grain size of the copper grains 1a tends to become small.

From the middle stage to the late stage of the electroplating in which the copper film is embedded in central and upper portions of the copper wiring 1, on the other hand, current density is high and the copper film is formed at a fast rate. In contrast with the case where current density is low, the formed copper film takes in a small number of impurities and the grain size of the copper grains 1a tends to become large.

The copper wiring 1 is formed by the above electroplating. Therefore, as shown in FIG. 2, the grain size of the copper grains 1a is comparatively small in the lower portion and the lower sidewall portions of the copper wiring 1. The grain size of the copper grains 1a is comparatively large in the central and upper portions of the copper wiring 1.

The copper wiring 1 has the above structure. As can be seen from the results shown in FIG. 1, areas through which an electric current intensively passes are the central and upper portions of the copper wiring 1 in which the grain size of the copper grains 1a is comparatively large and in which resistivity is low. With the electromigration copper atoms move by the flow of electrons. Accordingly, the flow of electrons has a great influence on copper atoms in the central and upper portions of the copper wiring 1.

The copper wiring 1 is touching the cap film 5 at the top. If the cap film 5 is an insulating film, it is known that adhesion between the copper wiring 1 and the cap film 5 is poor. That is to say, when the electromigration occurs, copper atoms diffuse mainly at an interface between the copper wiring 1 and the cap film 5. The reason for this is that adhesion at the interface between the copper wiring 1 and the cap film 5 is poor and that because comparatively many electrons flow through the central and upper portions of the copper wiring 1, it is easy for electromigration to occur.

Accordingly, copper grains should be comparatively large in a central portion of a copper wiring and copper grains should be comparatively small in portions around the central portion of the copper wiring.

Figure 3:
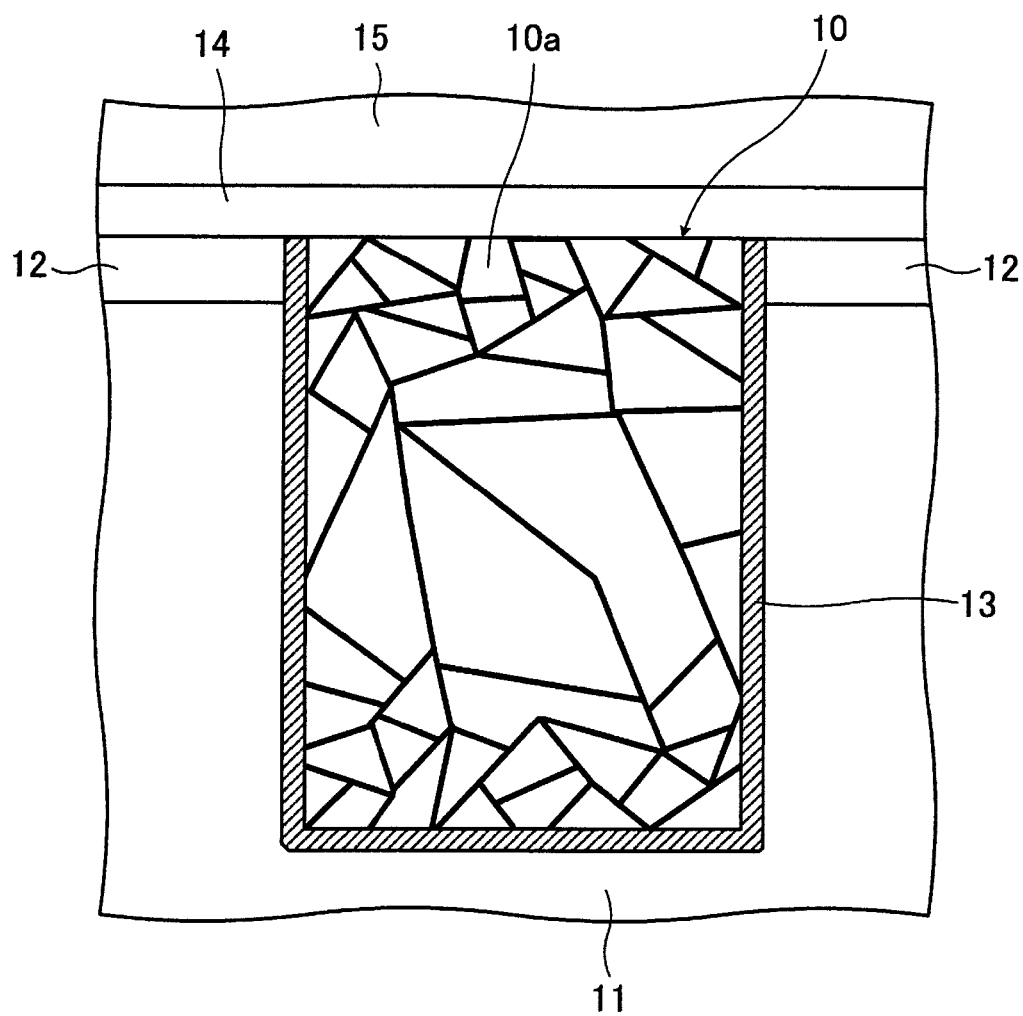
FIG. 3 is a fragmentary schematic sectional view showing an example of the structure of a copper wiring.

FIG. 3 is a fragmentary schematic sectional view showing an example of the structure of a copper wiring.

A copper wiring 10 shown in FIG. 3 is formed by the damascene method. This is the same with the copper wiring 1 shown in FIG. 2. A groove formed in an interlayer dielectric 11 of $SiO_2$ or the like and a hard mask 12 of SiN or the like is filled with a copper film with a barrier metal 13 which is formed by using Ta, Ti, TaN, or the like between. After the groove is formed, the barrier metal 13 and a seed copper film (not shown) are formed first over an entire surface. A copper film is formed by the electroplating method. The CMP is performed until the hard mask 12 gets exposed. By doing so, the copper wiring 10 is formed. A cap film 14 of SiC, SiN, or the like is formed over the copper wiring 10. Furthermore, an upper-layer interlayer dielectric 15 of $SiO_2$ or the like is formed over the cap film 14.

In the copper wiring 10 shown in FIG. 3, copper grains 10a in a central portion are comparatively large and the copper grains 10a in portions around the central portion, that is to say, in a lower portion, sidewall portions, and an upper portion are comparatively small. With the copper wiring 10 having the above structure, it is comparatively easy for an electric current to run through the central portion in which the copper grains 10a are comparatively large and in which resistivity is low. It is comparatively difficult for an electric current to run through portions around the central portion in which the copper grains 10a are comparatively small and in which resistivity is high. As a result, it is difficult for electromigration to occur at an interface between the copper wiring 10 and the cap film 14 at which adhesion is poor.

The higher the frequency of a signal which runs through a wiring becomes, generally speaking, the more intensively an electric current runs through the surface of the wiring. This phenomenon is referred to as a skin effect. Signals at frequencies of several gigahertz pass through ultramodern devices, so the skin effect cannot be neglected for ordinary objects. Depth at which an electric current flows is referred to as skin depth a given by $$\delta = \sqrt{\frac{2}{\omega \mu \sigma}} \quad (1)$$

where μ is the absolute permeability of a conductor ($4\pi \times 10^{-7}$ (H/m)), σ is electric conductivity, and ω is the angular frequency of the electric current. If the conductor is copper and the frequency of a signal is 1 GHz, then the skin depth σ is 2.09 μm. That is to say, if the frequency of a signal is 1 GHz, then the whole of an ordinary copper wiring with a thickness of sub-microns can be considered as a surface. Accordingly, it is not correct that an electric current runs only through the surface of a copper wiring because of the skin effect.

Therefore, an electric current flow path can be controlled by forming predetermined grain size distribution like that in the copper wiring 10 shown in FIG. 3.

The grain size distribution in the copper wiring 10 can be controlled by controlling, for example, electric current density at the time of the electroplating for forming the copper film.

To be concrete, the electric current density is made low in the beginning stage of the electroplating, that is to say, when the lower portion and the lower sidewall portions of the copper wiring 10 are formed. The electric current density is increased in the middle stage of the electroplating, that is to say, when the central portion of the copper wiring 10 is formed. The electric current density is made low again in the late stage of the electroplating, that is to say, when the upper portion of the copper wiring 10 is formed. By controlling the electric current density at the time of the electroplating in this way, the copper grains 10a in the central portion of the copper wiring 10 are made comparatively large and the copper grains 10a in the portions around the central portion of the copper wiring 10 are made comparatively small.

For example, the electric current density is increased step by step from the beginning stage to the middle stage of the electroplating and is decreased step by step from the middle stage to the late stage of the electroplating. The electric current density may be increased continuously from the beginning stage to the middle stage of the electroplating and be decreased continuously from the middle stage to the late stage of the electroplating. Conditions under which a void and the like do not appear in the formed copper wiring 10 should be set as the electric current density.

With the above method only the electric current density is controlled at electroplating time. By doing so, the copper wiring 10 in which it is comparatively easy for an electric current to run through the central portion and which has resistance to electromigration can be formed. In addition, the formation of the copper wiring 10 does not need a new manufacturing system.

In addition to the above method of controlling the electric current density at electroplating time, a method in which ion implantation is used or a method in which electroplating is performed more than one time under different conditions may be used for controlling the grain size distribution in the copper wiring 10.

Figure 4:
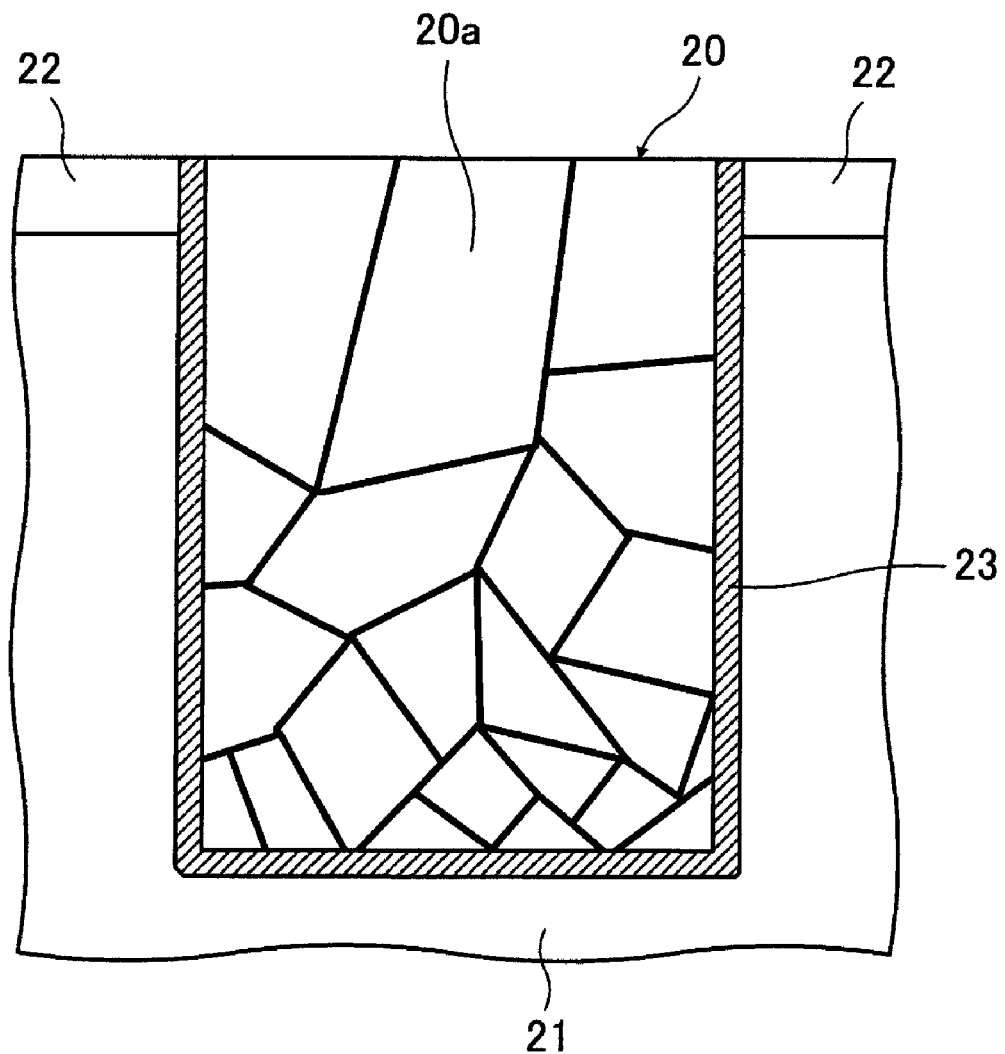
FIG. 4 is a fragmentary schematic sectional view showing a state after a CMP step.
Figure 5:
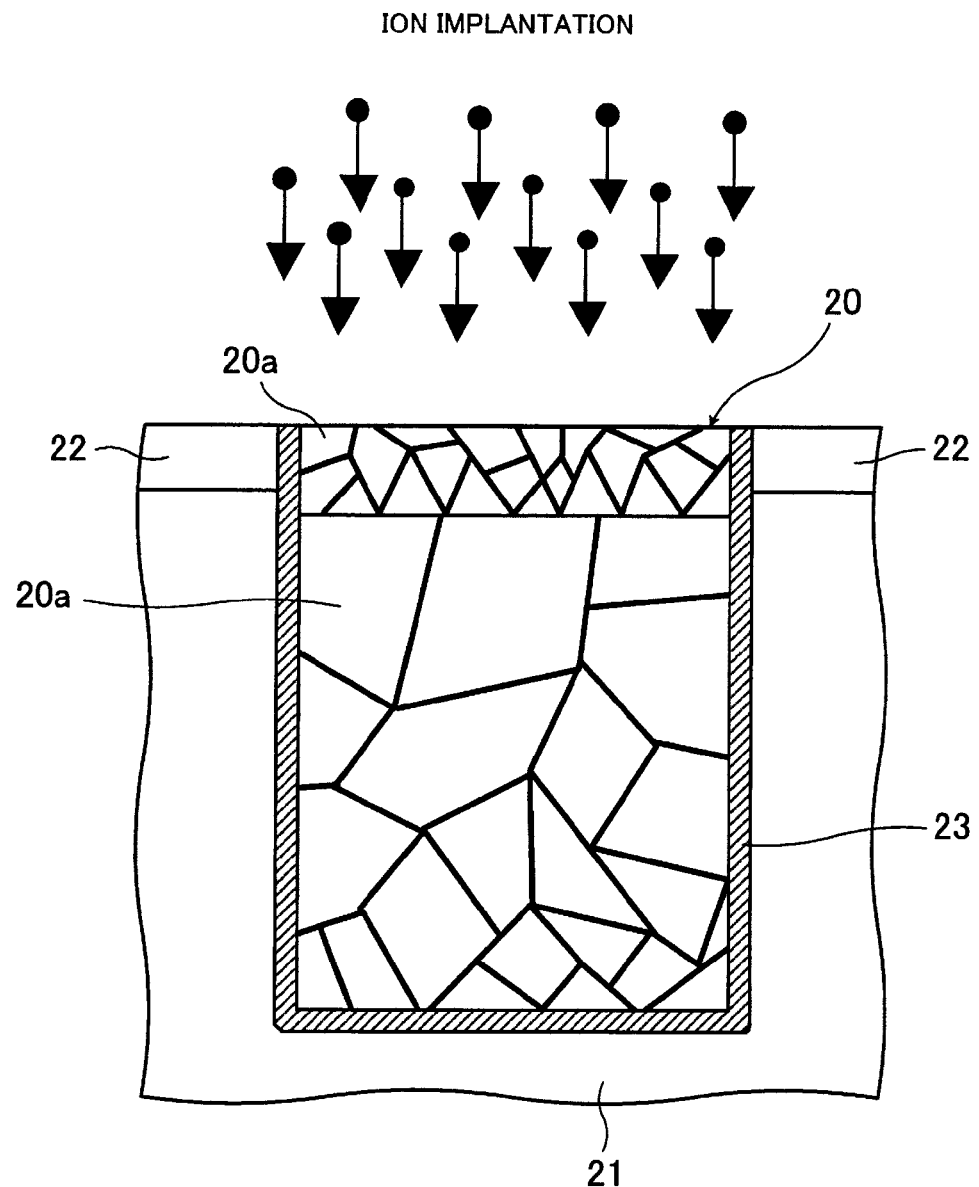
FIG. 5 is a fragmentary schematic sectional view showing an ion implantation step.

FIGS. 4 and 5 are views for describing a copper wiring formation method in which ion implantation is used. FIG. 4 is a fragmentary schematic sectional view showing a state after a CMP step. FIG. 5 is a fragmentary schematic sectional view showing an ion implantation step.

A groove is formed first in an interlayer dielectric 21 of $SiO_2$ or the like and a hard mask 22 of SiN or the like. A barrier metal 23 is formed by using Ta, Ti, TaN, or the like and a seed copper film (not shown) is formed. A copper film is then formed by electroplating. Electric current density is made low in the beginning stage of the electroplating and is increased from the middle stage to the late stage of the electroplating. That is to say, the conventional method is used for forming the copper film. The CMP is then performed until the hard mask 22 gets exposed. By doing so, a copper wiring 20 is formed. As a result, the state shown in FIG. 4 is obtained.

After the copper wiring 20 is formed in this way, ion implantation is performed on the copper wiring 20, as shown in FIG. 5, before the formation of a cap film. This ion implantation is performed by using an element, such as argon (Ar), neon (Ne), or xenon (Xe), and properly adjusting energy. Predetermined heat treatment is performed at need and only an upper portion of the copper wiring 20 is made polycrystalline or amorphous. After this treatment is performed, the cap film and the like are formed. FIG. 5 schematically shows the case where the upper portion of the copper wiring 20 is made polycrystalline.

For example, if the upper portion of the copper wiring 20 is made polycrystalline by this method, copper grains 20a in the upper portion of the copper wiring 20 become small. Accordingly, resistivity can be increased in the upper portion of the copper wiring 20. If the upper portion of the copper wiring 20 is made amorphous, resistivity can also be increased in the upper portion of the copper wiring 20. Therefore, it is comparatively easy for an electric current to run through a central portion of the copper wiring 20. Adhesion between the cap film and the copper wiring 20 is poor and it is comparatively difficult for an electric current to run through the upper portion of the copper wiring 20. This is the same with the copper wiring 10 shown in FIG. 3. As a result, resistance to electromigration is increased.

An element, such as carbon (C), oxygen (O), or nitrogen (N), which forms a compound with copper may be used for the ion implantation in place of the above element. The resistance of a compound formed by using such an element is higher than that of pure copper. Accordingly, the same effect that is obtained by making the upper portion of the copper wiring 20 polycrystalline or amorphous can be achieved.

Figure 6:
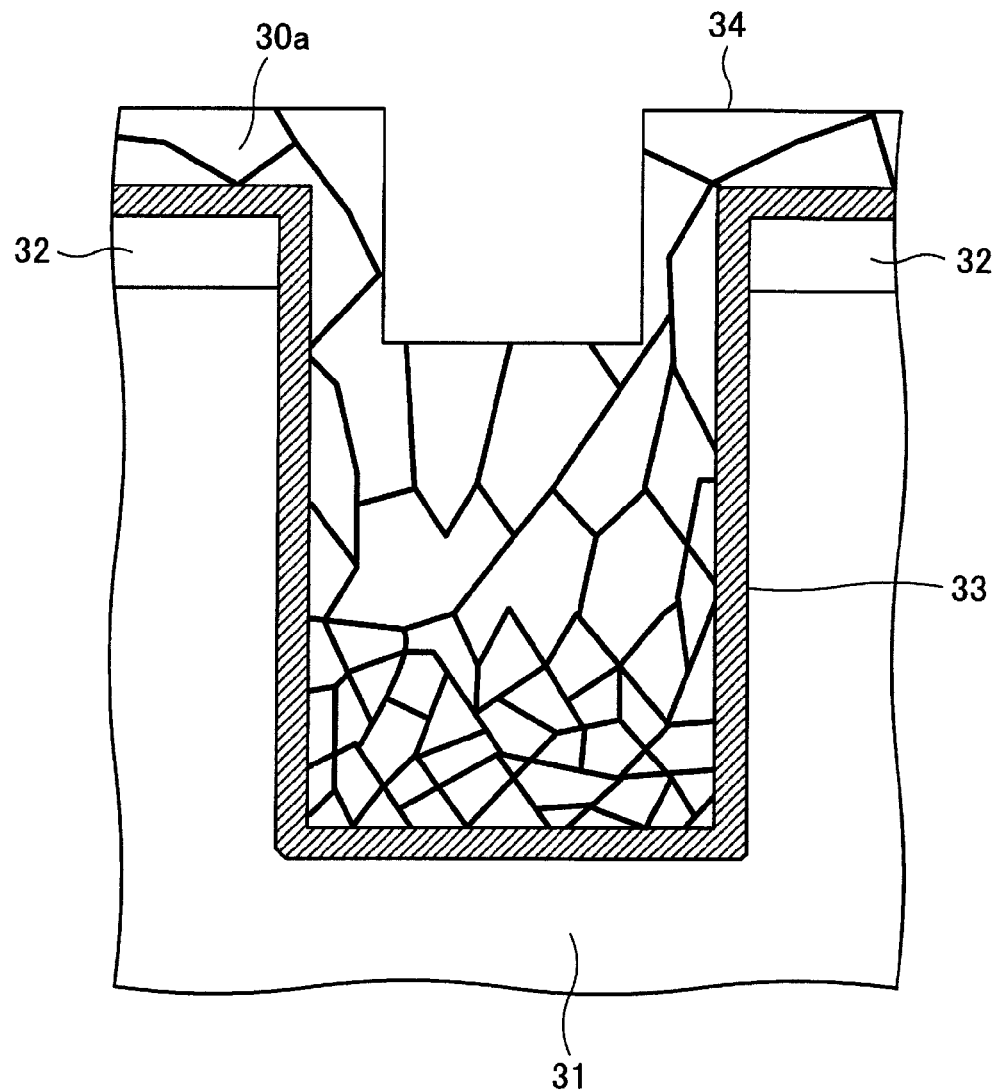
FIG. 6 is a fragmentary schematic sectional view showing a first electroplating step.
Figure 7:
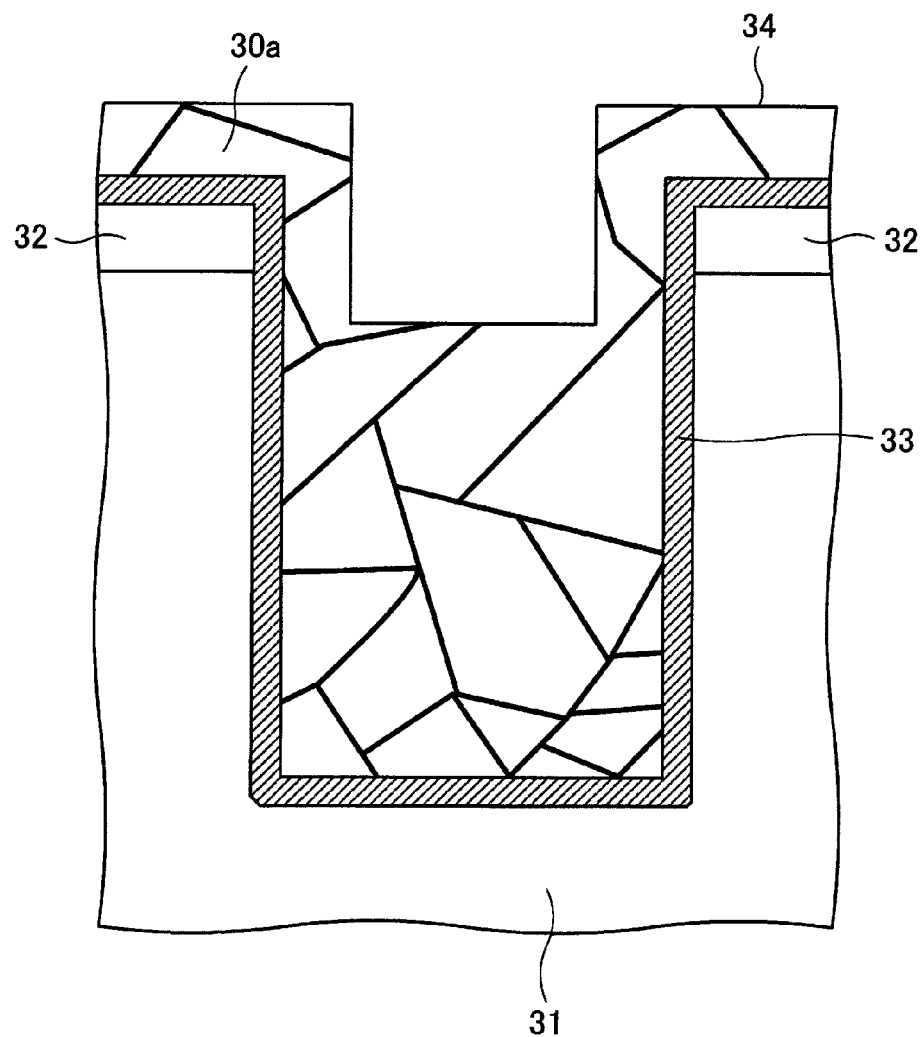
FIG. 7 is a fragmentary schematic sectional view showing a heat treatment step.
Figure 8:
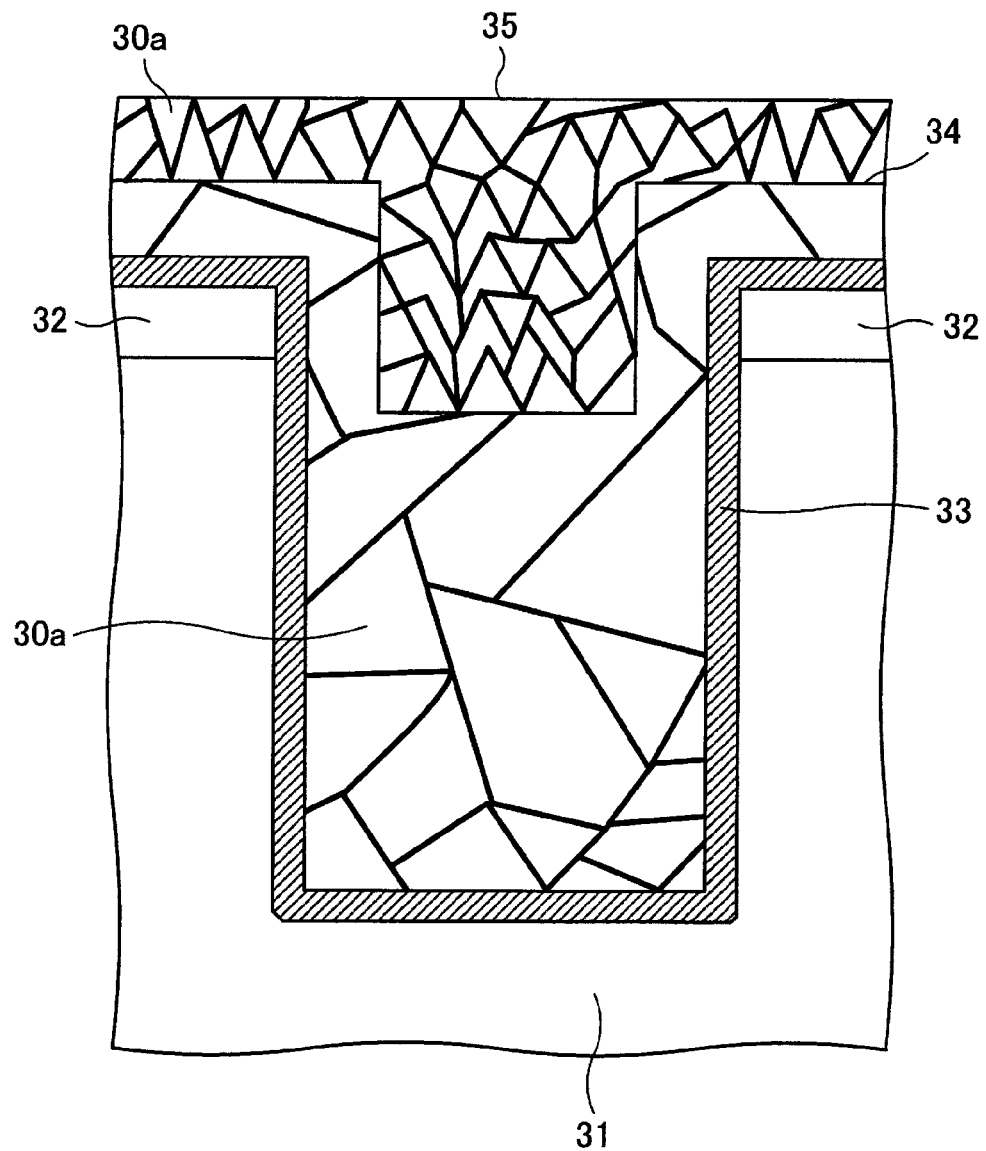
FIG. 8 is a fragmentary schematic sectional view showing a second electroplating step.

FIGS. 6 through 8 are views for describing a copper wiring formation method in which an electroplating step is divided into plural parts. FIG. 6 is a fragmentary schematic sectional view showing a first electroplating step. FIG. 7 is a fragmentary schematic sectional view showing a heat treatment step. FIG. 8 is a fragmentary schematic sectional view showing a second electroplating step.

This method is as follows. As shown in FIG. 6, a groove is formed first in an interlayer dielectric 31 of $SiO_2$ or the like and a hard mask 32 of SiN or the like. After that, a barrier metal 33 is formed by using Ta, Ti, TaN, or the like and a seed copper film (not shown) is formed. First electroplating is performed to form a copper film 34. Electric current density is made low in the beginning stage of the first electroplating and is made high in the middle stage of the first electroplating. Before the groove is completely filled in with the copper film 34, the first electroplating is ended. In the copper film 34 formed in this way, copper grains 30a are comparatively small in a lower portion and sidewall portions and are comparatively large in a central portion and an upper portion.

As shown in FIG. 7, heat treatment is then performed, for example, in an atmosphere of $N_2$ or in a vacuum at a temperature of about 350° C. for several minutes. By doing so, the copper grains 30a which make up the copper film 34 generally become larger.

As shown in FIG. 8, second electroplating is performed after the predetermined heat treatment to form a copper film 35. At this time electric current density is set to a constant low value. The groove is completely filled in by the second electroplating.

After that, the CMP is performed until the hard mask 32 gets exposed. A cap film and the like are formed over the hard mask 32.

By adopting this method, a copper wiring in the central portion of which the copper grains 30a are comparatively large and in the upper portion of which the copper grains 30a are comparatively small can be formed. The upper portion of the copper wiring is touching the cap film. As a result, resistance to electromigration can be increased.

In the above example, the electroplating step is divided into two parts. However, the electroplating step may be divided into three parts or more. Clearly, a copper wiring in which grain size is controlled more finely can be formed by subdividing the electroplating step and performing heat treatment between parts under predetermined conditions. Conditions (electric current density etc.) under which each electroplating step is performed and conditions (temperature, time, etc.) under which each heat treatment step is performed should be set properly according to the grain size of copper grains to be formed. However, such an increase in the number of times electroplating is performed may lead to an increase in the number of manufacturing steps. As a result, the costs may rise. Attention should be paid to this.

In addition, with the method in which electroplating is performed more than one time, there is no special limit to the wiring width of a copper wiring to be formed. This method can be used for forming a comparatively thin copper wiring with a wiring width of, for example, about 150 nm. Similarly, this method can be used for forming a comparatively thick copper wiring with a wiring width of, for example, about 1 μm. The same grain size distribution can be obtained in both cases.

The above descriptions have been given with a copper wiring as an example. However, the same applies to other metal wirings, such as an aluminum wiring in which a main component is polycrystalline aluminum (Al).

Figure 9:
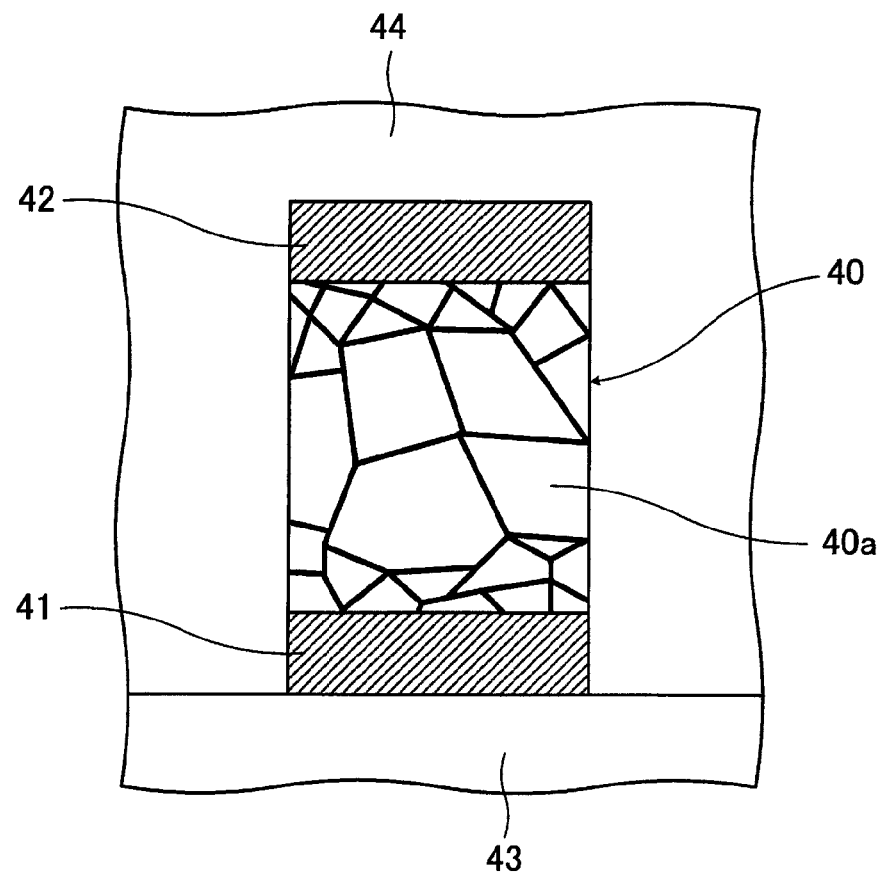
FIG. 9 is a fragmentary schematic sectional view showing an example of the structure of an aluminum wiring.

FIG. 9 is a fragmentary schematic sectional view showing an example of the structure of an aluminum wiring.

Barrier metals 41 and 42 are formed on the bottom and the top, respectively, of an aluminum wiring 40 shown in FIG. 9 by using a refractory metal, such as Ta, Ti, or TaN.

The aluminum wiring 40 is formed in, for example, the following way. A refractory metal film, an aluminum film (or a film in which a main component is aluminum), and a refractory metal film are formed first in order over an interlayer dielectric 43 of $SiO_2$ or the like by the sputtering method. By treating them by dry etching or the like, a three-layer structure which is shown in FIG. 9 and which includes the barrier metal 41, the aluminum wiring 40, and the barrier metal 42 is obtained. An interlayer dielectric 44 of $SiO_2$ or the like is then formed so as to cover the three-layer structure including the aluminum wiring 40.

Sputtering conditions are set so that aluminum grains 40a will be comparatively small in the beginning stage and the late stage of forming the aluminum film by the sputtering method, that is to say, at the time of forming lower and upper portions of the aluminum wiring 40 and so that the aluminum grains 40a will be comparatively large in the middle stage of forming the aluminum film by the sputtering method, that is to say, at the time of forming a central portion of the aluminum wiring 40. To be concrete, the grain size of the aluminum grains 40a should be controlled by adjusting plasma voltage at sputtering time or controlling introduced gas. By forming the aluminum film in this way, the aluminum wiring 40 in the lower and upper portions of which the aluminum grains 40a are comparatively small and in the central portion of which the aluminum grains 40a are comparatively large is obtained after the treating. Therefore, the same effect that is described about the above copper wiring can be obtained.

With an ordinary aluminum wiring electrons run mainly through an area near an interface between the upper barrier metal and the wiring and an area near an interface between the lower barrier metal and the wiring. Therefore, electromigration tends to occur in these areas. With the above aluminum wiring 40, however, the grain size of the aluminum grains 40a is small in an area near an interface between the upper barrier metal and the aluminum wiring 40 and an area near an interface between the lower barrier metal and the aluminum wiring 40. As a result, resistivity is high in these areas and it is comparatively easy for an electric current to run through the central portion of the aluminum wiring 40. Accordingly, the occurrence of such electromigration can be prevented.

In the above example, the barrier metals 41 and 42 are formed on the bottom and the top, respectively, of an aluminum wiring 40. However, only the barrier metal 41 may be formed on the bottom of an aluminum wiring 40.

As has been described in the foregoing, a metal wiring having resistance to electromigration can be formed by using a conventional semiconductor device manufacturing system and properly controlling conditions under which the metal wiring is formed. A semiconductor device having such a metal wiring with high reliability can be realized stably.

Examples will now be described.

EXAMPLE 1

An example using the method in which the condition of electric current density is controlled at electroplating time will be described. FIGS. 10A through 10J are sectional views showing steps for forming a copper wiring. A transistor portion is not shown. The steps will be described in order.

Figure 10A:
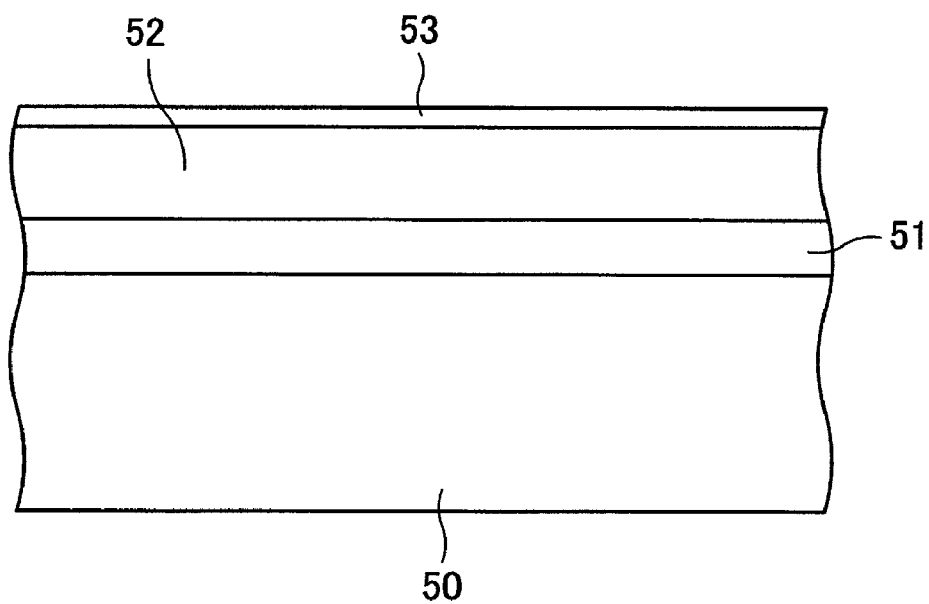
FIG. 10A is a fragmentary schematic sectional view showing the step of forming an interlayer dielectric and a hard mask.

FIG. 10A is a fragmentary schematic sectional view showing the step of forming an interlayer dielectric and a hard mask.

A low dielectric constant (low-k) film of silicon oxide carbide (SiOC) with a thickness of about 250 nm is deposited first over a foundation insulating film 51 of $SiO_2$ formed over a silicon substrate 50 by the CVD method to form an interlayer dielectric 52. A hard mask 53 with a thickness of about 50 nm is formed over the interlayer dielectric 52.

Figure 10B:
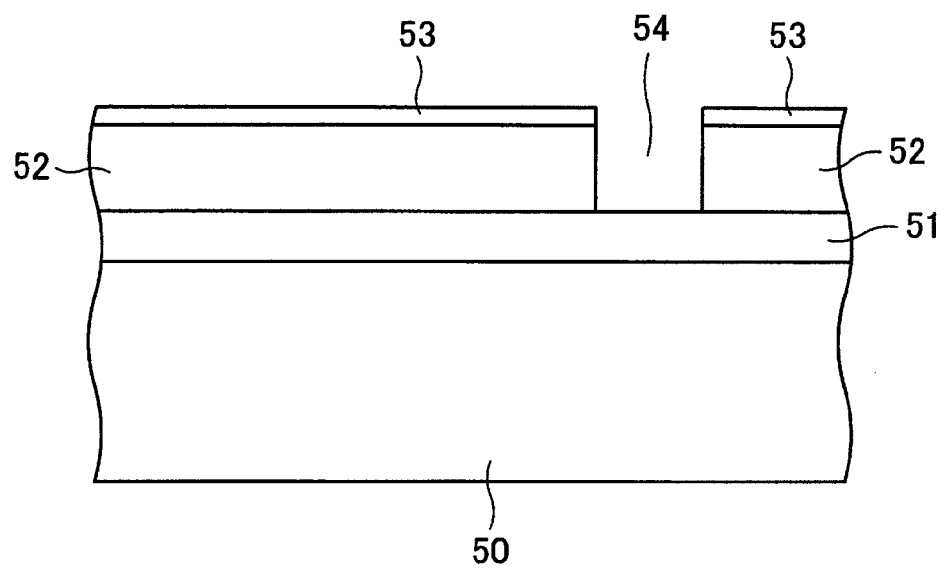
FIG. 10B is a fragmentary schematic sectional view showing the step of forming a groove.

FIG. 10B is a fragmentary schematic sectional view showing the step of forming a groove.

After the interlayer dielectric 52 and the hard mask 53 are formed, a groove 54 with a width of 100 to 1000 nm for a lower layer copper wiring which pierces the interlayer dielectric 52 and the hard mask 53 is formed by photolithography and etching.

Figure 10C:
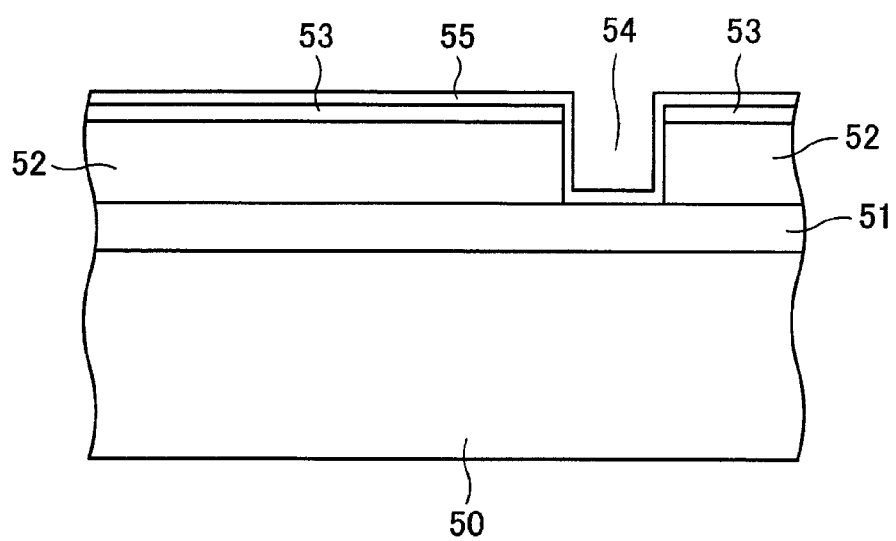

FIG. 10C is a fragmentary schematic sectional view showing the step of forming a barrier metal and the like.

After the groove 54 is formed, the sputtering method is used for forming a barrier metal 55 of Ta or TaN and a seed copper film (not shown).

Figure 10D:
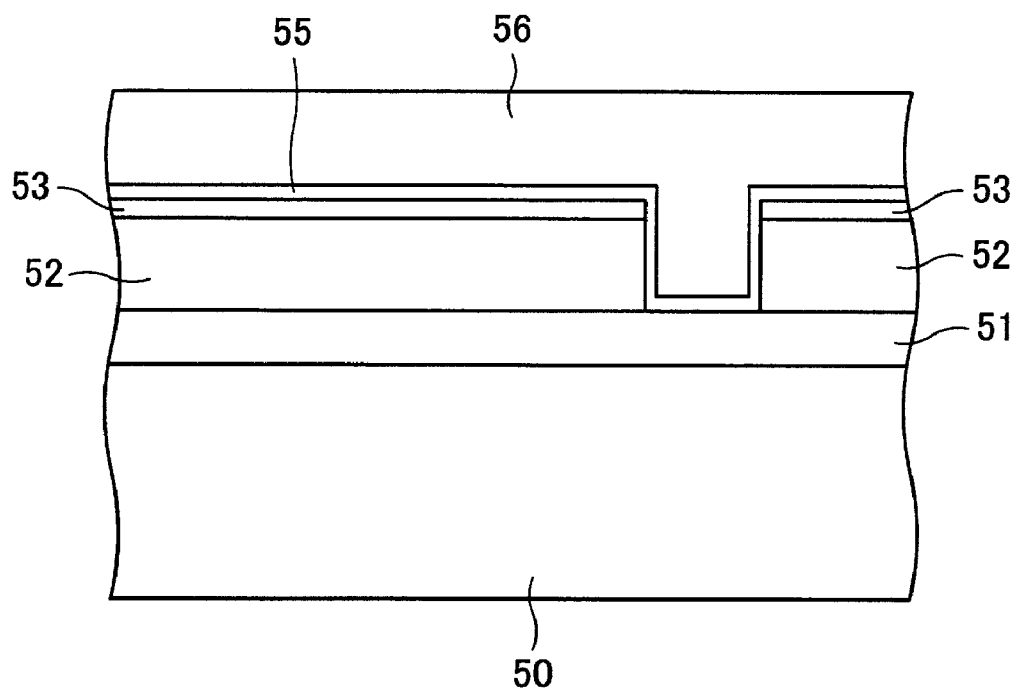
FIG. 10D is a fragmentary schematic sectional view showing an electroplating step.

FIG. 10D is a fragmentary schematic sectional view showing an electroplating step.

After the barrier metal 55 and the seed copper film are formed, a copper film 56 is formed over the seed copper film by electroplating to fill in the groove 54 shown in FIGS. 10B and 10C with the copper film 56.

In this case, electric current density is set to about 3 $mA/cm^2$ in the beginning stage of the electroplating (at the time of filling in a lower portion and lower sidewall portions of the groove 54). The electric current density is gradually increased from this value and is set to about 20 $mA/cm^2$ in the middle stage of the electroplating (at the time of filling in a central portion of the groove 54). The electric current density is gradually decreased from this value and is set to about 3 $mA/cm^2$ in the late stage of the electroplating (at the time of filling in an upper portion of the groove 54).

The electric current density is 3 $mA/cm^2$ in the beginning stage of the electroplating and is 20 $mA/cm^2$ in the middle stage of the electroplating. In this case, the electric current density is increased step by step. For example, the electric current density is increased first to 5 $mA/cm^2$, then to 7 $mA/cm^2$, then to 9 $mA/cm^2$, and so on. The electric current density is 20 $mA/cm^2$ in the middle stage of the electroplating and is 3 $mA/cm^2$ in the late stage of the electroplating. In this case, the electric current density is decreased step by step in the same way.

Figure 10E:
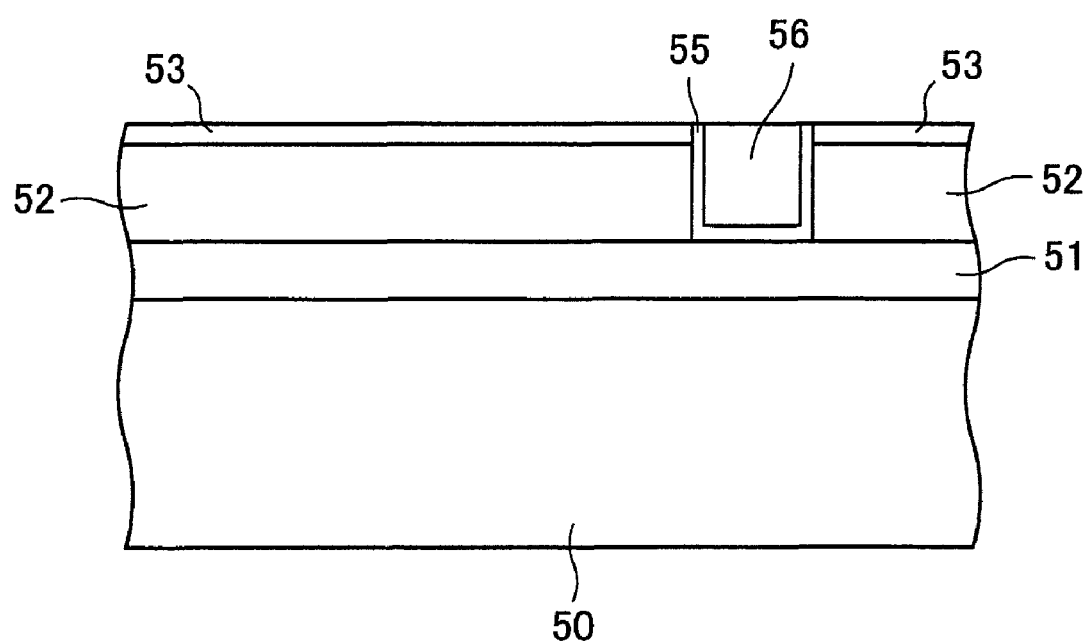
FIG. 10E is a fragmentary schematic sectional view showing a first CMP step.

FIG. 10E is a fragmentary schematic sectional view showing a first CMP step.

After the copper film 56 is formed by the electroplating, planarization is performed by the CMP to remove unnecessary portions of the copper film 56, the seed copper film thereunder, and the barrier metal 55 thereunder. By doing so, the lower layer copper wiring including the seed copper film and the copper film 56 is formed.

Figure 10F:
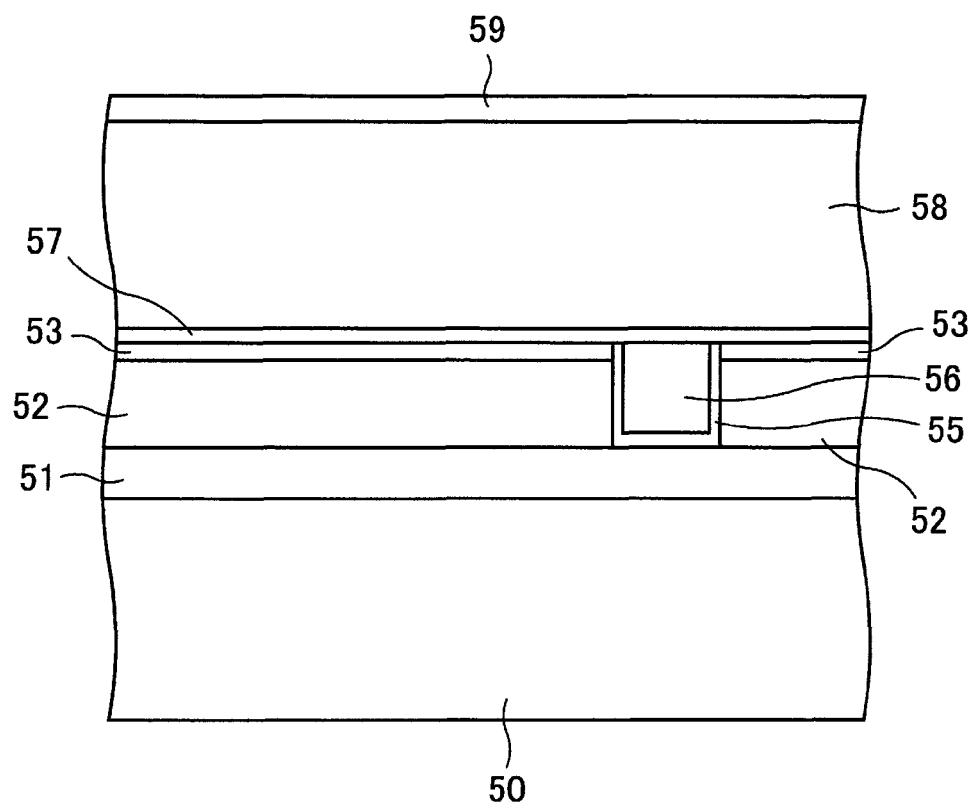

FIG. 10F is a fragmentary schematic sectional view showing the step of forming a first cap film and the like.

After the CMP is performed, a cap film 57 of SiC with a thickness of about 50 nm is formed by the CVD method as a film for preventing copper atoms contained in the copper wiring from diffusing. An interlayer dielectric 58 of SiOC with a thickness of about 450 nm is then formed by the CVD method. In addition, a hard mask 59 with a thickness of about 50 nm is formed by the CVD method.

Figure 10G:
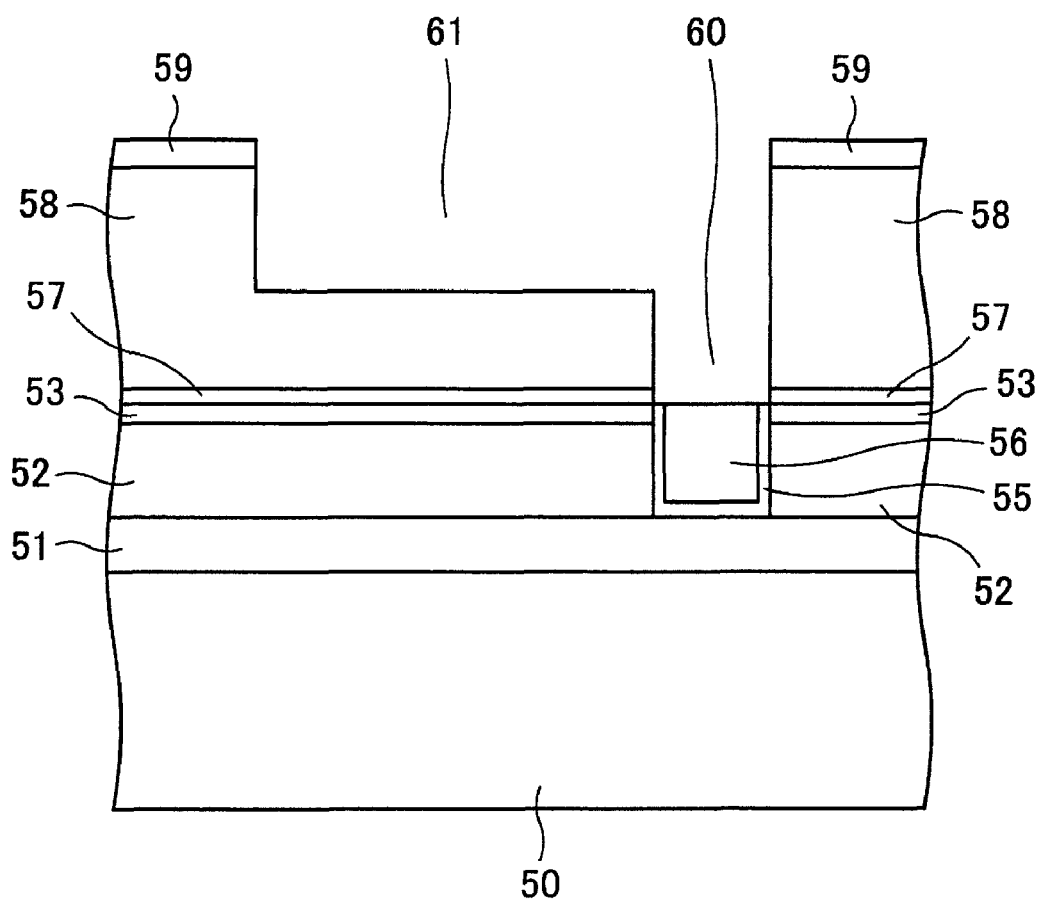
FIG. 10G is a fragmentary schematic sectional view showing the step of forming a via hole and a groove.

FIG. 10G is a fragmentary schematic sectional view showing the step of forming a via hole and a groove.

After the cap film 57, the interlayer dielectric 58, and the hard mask 59 are formed, a dual damascene method is used for forming a via hole 60 which connects with the lower layer copper wiring and a groove 61 for an upper layer copper wiring by the photolithography and etching.

After that, electroplating is performed by the same procedure that is adopted for forming the lower layer copper wiring to fill in the groove 61.

Figure 10H:
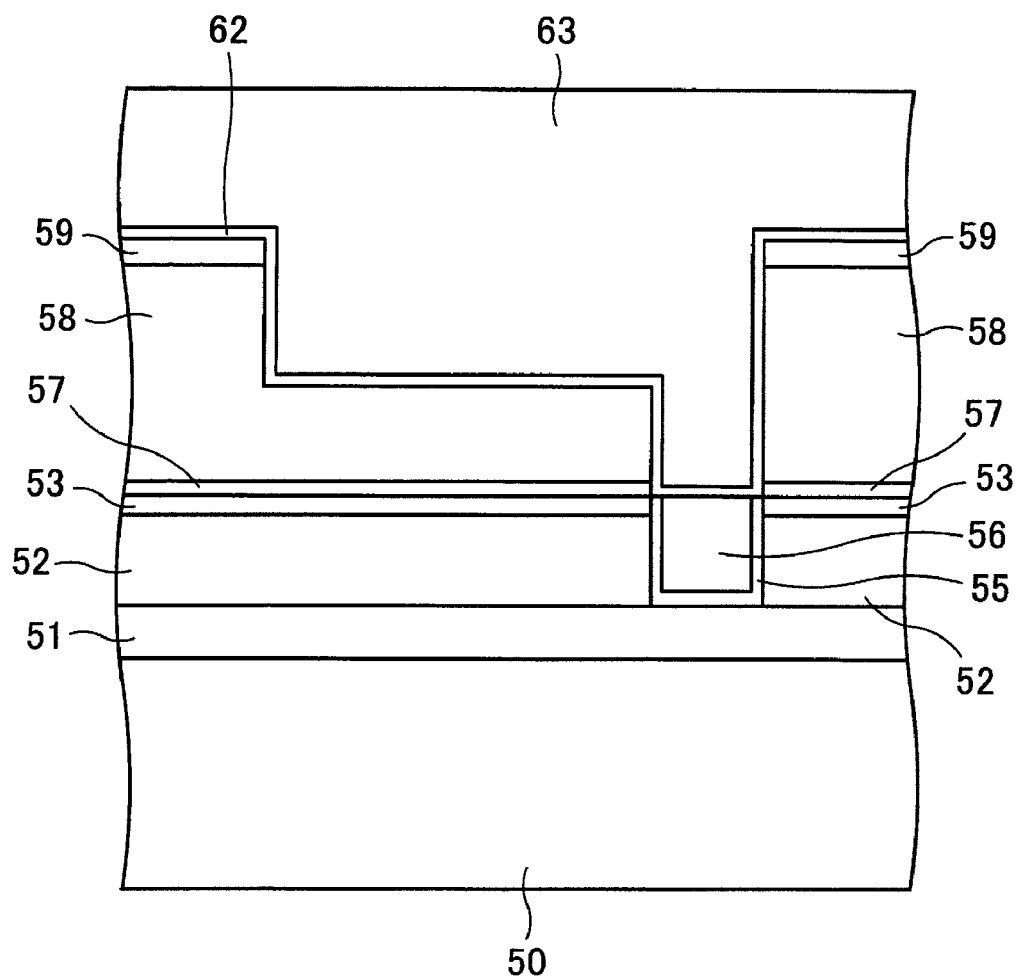
FIG. 10H is a fragmentary schematic sectional view showing a state after the electroplating step.

FIG. 10H is a fragmentary schematic sectional view showing a state after the electroplating step.

After the groove 61 shown in FIG. 10G is formed, a barrier metal 62 and a seed copper film (not shown) are formed by the sputtering method. A copper film 63 is then formed over the seed copper film by electroplating.

In this case, electric current density is set to about 3 $mA/cm^2$ in the beginning stage of the electroplating (at the time of filling in the via hole 60 and a lower portion and lower sidewall portions of the groove 61). The electric current density is gradually increased from this value and is set to about 20 mA/cm² in the middle stage of the electroplating (at the time of filling in a central portion of the groove 61). The electric current density is gradually decreased from this value and is set to about 3 mA/cm² in the late stage of the electroplating (at the time of filling in an upper portion of the groove 61). The electric current density is changed step by step. This is the same with the above case where the lower layer copper wiring is formed.

Figure 10I:
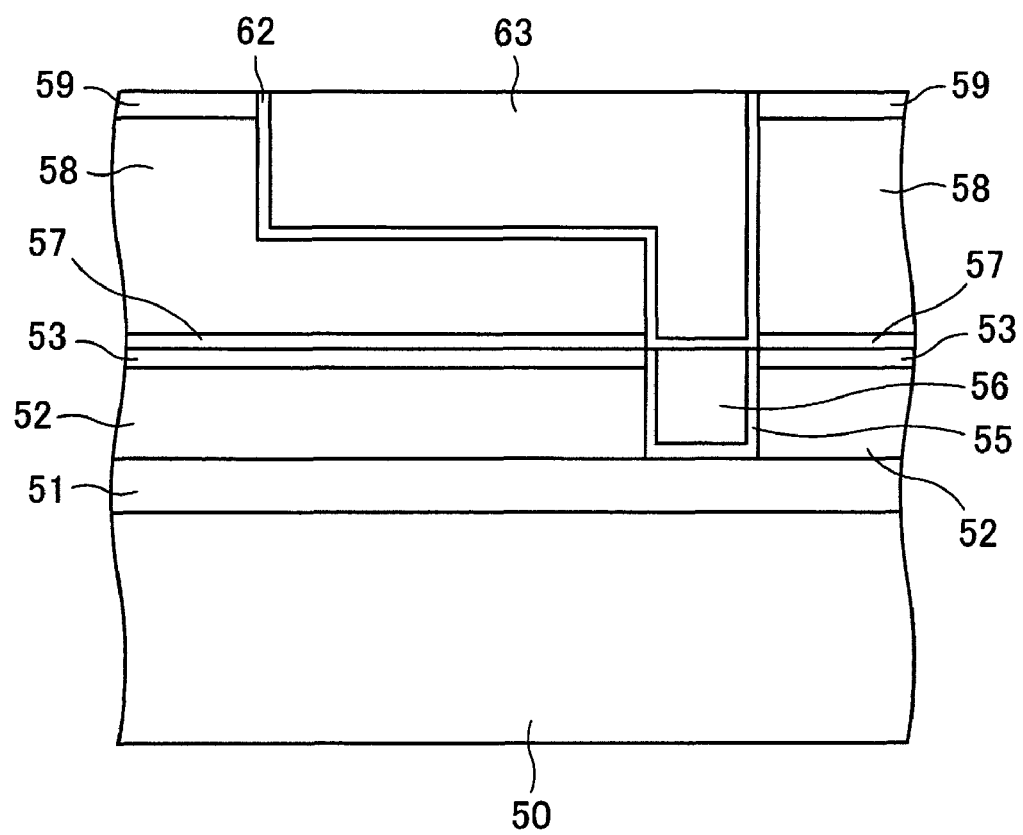
FIG. 10I is a fragmentary schematic sectional view showing a second CMP step.

FIG. 10I is a fragmentary schematic sectional view showing a second CMP step.

After the copper film 63 is formed by the electroplating, the CMP is performed until the hard mask 59 gets exposed. By doing so, unnecessary portions of the copper film 63, the seed copper film thereunder, and the barrier metal 62 thereunder are removed. As a result, a via which connects with the lower layer copper wiring and the upper layer copper wiring are formed at the same time.

Figure 10J:
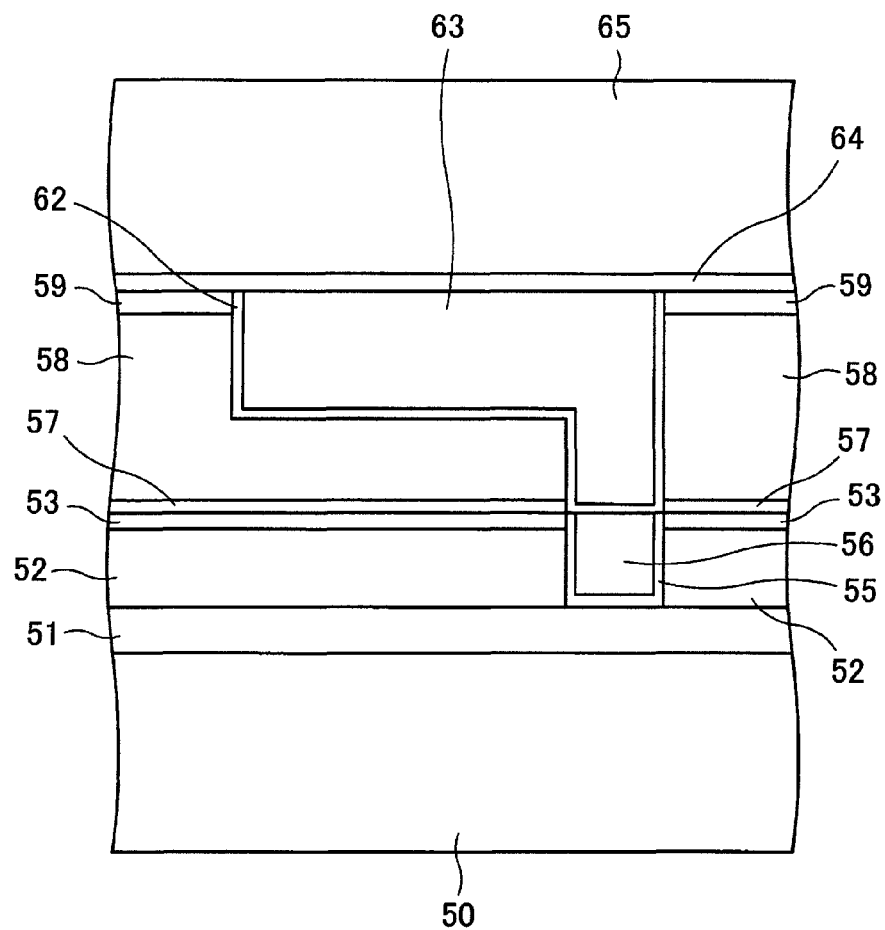

FIG. 10J is a fragmentary schematic sectional view showing the step of forming a second cap film and the like.

After the via and the upper layer copper wiring are formed, a cap film 64 of SiC with a thickness of about 50 nm is formed by the CVD method. An interlayer dielectric 65 of SiOC is formed over the cap film 64 by the CVD method.

By performing the above steps, a copper wiring structure is formed. After that, a predetermined number of wiring layers are formed in the same way. For example, a pad and a protection film are then formed. By doing so, a semiconductor device is completed.

In addition, for the sake of comparison a sample was formed by using a conventional manufacturing method. That is to say, the sample was formed by the following method. When a copper film is embedded by electroplating, electric current density is set to about 3 mA/cm² in the beginning stage of the electroplating. The electric current density is gradually increased and is set to 20 mA/cm² in the middle stage of the electroplating. After that, the electric current density is not changed until a groove is completely filled in with the copper film. The other process conditions are the same with the above example 1.

Many cross sections of a copper wiring formed by the method used in the above example 1 were observed by the TEM and EBSP methods. As a result, it turned out that the average grain size of copper grains was about 0.1 μm in lower, upper, and sidewall portions of each cross section of the copper wiring and that the average grain size of copper grains was about 0.5 μm in a central portion of each cross section of the copper wiring. Many cross sections of the copper wiring, which is the sample formed for comparison, were also observed by the TEM and EBSP methods. As a result, it turned out that the average grain size of copper grains was about 0.1 μm in lower and sidewall portions of each cross section of the copper wiring, that the average grain size of copper grains was about 0.5 μm in central and upper portions of each cross section of the copper wiring, and that as the distance from the top of the copper wiring became shorter, the average grain size of copper grains grew larger.

In addition, electromigration tests were run on a copper wiring formed by the electroplating method used in the above example 1 and a copper wiring formed by the conventional electroplating method used for forming the above sample. Each test pattern has a two-layer copper wiring structure. A lower layer copper wiring is about 300 nm in width and is about 100 μm in length. Vias are connected to both ends of the lower layer copper wiring and an upper layer copper wiring is connected to each via. Each upper layer copper wiring is about 1000 nm in width and a pad is formed directly thereon. An electric current corresponding to 2 mA/cm² was sent from one upper layer copper wiring, through one via, the lower layer copper wiring, and the other via, to the other upper layer copper wiring at a test temperature of about 300° C. As a result, it turned out that the life of the copper wiring formed by the electroplating method used in the above example 1 was about twice longer than that of the copper wiring formed by the conventional electroplating method used for forming the above sample.

EXAMPLE 2

An example using the method in which ion implantation is used will be described.

The same steps that are shown in FIGS. 10A through 10C of the above example 1 are performed for forming a copper wiring. In a next electroplating step of FIG. 10D for forming a lower layer copper wiring, the conventional method is used for forming a copper film 56. That is to say, electric current density is set to about 3 mA/cm² in the beginning stage of the electroplating in which a lower portion and lower sidewall portions of a groove 54 shown in FIG. 10C are filled in, and is then increased gradually. The electric current density is set to 20 mA/cm² in the middle stage of the electroplating in which a central portion of the groove 54 is filled in. After that, the electric current density is not changed until the groove 54 is completely filled in.

Planarization is then performed by the CMP in the same way that is shown in FIG. 10. After that, ion implantation is performed before a cap film 57 shown in FIG. 10F is formed. When the ion implantation is performed, Ar is used as implanted ions and acceleration voltage at implantation time is set to about 50 to 100 keV. By doing so, the lower layer copper wiring is formed.

After the ion implantation is performed, the same steps that are shown in FIGS. 10F through 10J of the above example 1 are performed. The dual damascene method is used for forming a via which connects with the lower layer copper wiring and an upper layer copper wiring at the same time. In an electroplating step of FIG. 10H for forming the via and the upper layer copper wiring, the conventional method is used for forming a copper film 63. This is the same with the lower layer copper wiring. After the CMP step shown in FIG. 10, Ar is used for performing ion implantation. Acceleration voltage is set to about 50 to 100 keV.

After the above copper wiring structure is formed, a predetermined number of wiring layers are formed in the same way. For example, a pad and a protection film are then formed. By doing so, a semiconductor device is completed.

By performing the ion implantation in this way for forming the lower layer copper wiring and the upper layer copper wiring, Ar ions get between crystal lattices of the copper films 56 and 63 formed in the electroplating steps and derange the crystallinity of the copper films 56 and 63. As a result, areas in which ions are implanted become amorphous. By controlling conditions under which the ion implantation is performed, a projected range of Ar ions can be controlled. In this example, Ar ions are implanted in an upper portion of each of the lower layer copper wiring and the upper layer copper wiring.

Many cross sections of the copper wiring formed in this way were observed by the TEM and EBSP methods. As a result, a surface portion of each cross section of the copper wiring was in an amorphous state and small polycrystals the average grain size of which was about 0.1 μm or less were observed in an area nearer a central portion of each cross section of the copper wiring. However, it turned out that the average grain size of copper grains was about 0.5 μm in the central portion of each cross section of the copper wiring which implanted Ar ions did not reach. This is the same with the above sample (see the above example 1).

As with the above example 1, electromigration tests were run on a copper wiring like that formed in this example 2 by the use of the ion implantation method and a copper wiring like the above sample formed without using the ion implantation method. The structure of each test pattern is the same as the structure (two-layer copper wiring structure) of the test pattern described in the above example 1. In addition, conditions under which the electromigration tests were run are the same as those described in the above example 1 (test temperature was about 300° C. and an electric current was about 2 mA/cm$^2$). As a result, it turned out that the life of the copper wiring formed by the use of the ion implantation method was about one and a half times longer than that of the copper wiring formed without using the ion implantation method.

In this example, the upper portion of the copper wiring was put into an amorphous state by implanting Ar ions. As described above, however, another element may be used. By doing so, a copper wiring having the same structure is formed.

Furthermore, a higher resistance compound can be formed in the upper portion of the copper wiring by implanting carbon ions, oxygen ions, nitrogen ions, or the like. In this case, heat treatment is performed at need after the ion implantation to form a predetermined compound. However, heat is sufficiently applied in steps (including the step of forming an interlayer dielectric) after the ion implantation, so the heat treatment for forming the compound is not necessarily required after the ion implantation. In any case, the compound is formed by heat applied after the ion implantation. Accordingly, acceleration voltage can be set to a low value at ion implantation time and damage, such as a lattice defect, to the copper wiring can be decreased.

EXAMPLE 3

An example using the method in which the electroplating step is divided into two parts will be described.

The same steps that are shown in FIGS. 10A through 10C of the above example 1 are performed for forming a copper wiring. In a next electroplating step of FIG. 10D for forming a lower layer copper wiring, electroplating is performed twice under different conditions.

First, electric current density is set to about 3 mA/cm$^2$ in the beginning stage of first electroplating. The electric current density is gradually increased and is set to 20 mA/cm$^2$ in the middle stage of the first electroplating. By doing so, a lower portion, lower sidewall portions, and a central portion of a groove 54 shown in FIG. 10C are filled in. The first electroplating is ended at this point of time. In this state heat treatment is performed at a temperature of about 350° C. As a result, copper grains grow and their grain sizes increase. After the heat treatment is performed, second electroplating is performed to completely fill in the groove 54. When the second electroplating is performed, electric current density is set to about 5 mA/cm$^2$, that is to say, to a constant low value.

The CMP step shown in FIG. 10E is then performed. By doing so, a lower layer copper wiring is formed.

After the lower layer copper wiring is formed, the same steps that are shown in FIGS. 10F through 10J of the above example 1 are performed. The dual damascene method is used for forming a via which connects with the lower layer copper wiring and an upper layer copper wiring at the same time. An electroplating step of FIG. 10H for forming the via and the upper layer copper wiring is performed in the following way. Electric current density is set first to about 3 mA/cm$^2$ in the beginning stage of electroplating in which a via hole 60 and a lower portion and lower sidewall portions of a groove 61 are filled in. The electric current density is then increased gradually to 20 mA/cm$^2$ and a central portion of the groove 61 is filled in (first electroplating). After heat treatment is performed at a temperature of about 350° C., electroplating (second electroplating) is performed with the electric current density set to about 5 mA/cm$^2$ (constant value) to completely fill in the groove 61. The CMP step shown in FIG. 10I is then performed. By doing so, the via and the upper layer copper wiring are formed.

After the above copper wiring structure is formed, a predetermined number of wiring layers are formed in the same way. For example, a pad and a protection film are then formed. By doing so, a semiconductor device is completed.

Many cross sections of the copper wirings formed in this way were observed by the TEM and EBSP methods. As a result, it turned out that the average grain size of copper grains was about 0.1 µm in lower, sidewall, and upper portions of each cross section of the copper wirings and that the average grain size of copper grains was about 0.6 µm in a central portion of each cross section of the copper wirings. Therefore, it was ascertained that the lower layer copper wiring and the upper layer copper wiring in the central portions of which the grain size of copper grains is comparatively large and in portions around the central portions of which the grain size of copper grains is comparatively small could be formed by this method.

Furthermore, as with the above example 1, electromigration tests were run on a copper wiring like that formed in this example 3 by performing electroplating twice and a copper wiring formed by the conventional electroplating method. As a result, it turned out that the life of the copper wiring formed by performing electroplating twice was about twice longer than that of the copper wiring formed by the conventional electroplating method.

EXAMPLE 4

A method for forming an aluminum wiring will be described.

An SiO$_2$ film is formed over a Si substrate. A barrier metal of Ti or titanium nitride (TiN) with a thickness of about 80 nm is formed over the SiO$_2$ film by the sputtering method. An Al film with a thickness of 450 nm which contains about 0.5 weight percentage copper is formed over the barrier metal by the sputtering method.

Halfway through the formation of the Al film, sputtering conditions are changed as follows. Until the Al film attains a thickness of 50 nm, that is to say, in the beginning stage of forming the Al film, sputtering power is made higher than a proper value to set a rate at which the Al film is formed to a great value, that is to say, to 1 µm/min. After the Al film attains a thickness of about 50 nm, the rate at which the Al film is formed is reduced to 0.2 µm/min. After the Al film attains a thickness of about 400 nm, that is to say, in the late stage of forming the Al film, the sputtering power is made higher again than the proper value to set the rate at which the Al film is formed to 1 µm/min. Since the nucleation controls the grain size in the growth of Al films, the grain size becomes small with the increase of deposition rate. Accordingly, the grain size has a tendency to become small with an increase in the rate at which the Al film is formed. By using this tendency, the rate at which the Al film is formed is made fast in the beginning and late stages so that aluminum grains will be small. The rate at which the Al film is formed is made slow in the middle stage so that aluminum grains will be large.

After the Al film is formed, a barrier metal of Ti or TiN with a thickness of about 50 nm is formed again by the sputtering method. A pattern with a width of about 0.5 µm is formed by the photolithography and excess metal portions are removed by RIE. As a result, a lower layer aluminum wiring with a wiring width of about 0.5 µm over and under which the barrier metals are formed is formed.

After that, an SiO$_2$ film is deposited over an entire surface and a tungsten (W) via which connects with the lower layer aluminum wiring is formed. In addition, the same steps are repeated to form an upper layer aluminum wiring.

After the above aluminum wiring structure is formed, a predetermined number of wiring layers are formed in the same way. For example, a pad and a protection film are then formed. By doing so, a semiconductor device is completed.

Many cross sections of the aluminum wirings formed in this way were observed by the TEM and EBSP methods. As a result, it was ascertained that the average grain size of aluminum grains was about 0.2 µm in a lower portion (portion near the lower barrier metal) and an upper portion (portion near the upper barrier metal) of each cross section of the aluminum wirings and that the average grain size of aluminum grains was about 0.5 µm in a central portion of each cross section of the aluminum wirings. The aluminum wirings were formed by dry etching, so the average grain size of aluminum grains in sidewall portions, that is to say, in portions near an interface between each $SiO_2$ film and each aluminum wiring, was equal to that of the aluminum grains in the central portion.

Electromigration tests were run on an aluminum wiring formed by this method and an aluminum wiring formed by the conventional method, that is to say, formed without changing sputtering conditions halfway. Each test pattern has a two-layer aluminum wiring structure. W vias are connected to both ends of a lower layer aluminum wiring and an upper layer aluminum wiring is connected to each via. A pad is formed over each upper layer aluminum wiring. An electric current corresponding to 1.5 $mA/cm^2$ was sent from one upper layer aluminum wiring, through one W via, the lower layer aluminum wiring, and the other W via, to the other upper layer aluminum wiring at a test temperature of about 250° C. As a result, it turned out that the life of the aluminum wiring formed by the above method was about one and a half times longer than that of the aluminum wiring formed by the conventional method.

With the aluminum wiring electrons run mainly through a portion near an interface between the upper barrier metal and the aluminum wiring and a portion near an interface between the lower barrier metal and the aluminum wiring. The grain size of the aluminum grains in these portions becomes small, so resistivity gets high in these portions. As a result, it is comparatively easy for an electric current to run through the central portion. Accordingly, resistance to electromigration is probably increased.

In this example, the grain size of aluminum grains is controlled by changing the rate at which the Al film is formed by sputtering. However, the grain size of aluminum grains may be controlled by, for example, changing temperature at which the Al film is formed by sputtering or introducing a minute amount of hydrogen ($H_2$) gas or oxygen ($O_2$) gas at sputtering time. That is to say, if the temperature at which the Al film is formed by sputtering is high, then diffusion at the surface of the Al film is promoted. As a result, the grain size of aluminum grains becomes large. If the temperature at which the Al film is formed by sputtering is low, then nucleus growth is promoted. As a result, the grain size of aluminum grains becomes small. The introduction of a minute amount of $H_2$ gas or $O_2$ gas deoxidizes or oxidizes aluminum grains and their grain sizes change. Therefore, the grain size of aluminum grains can also be controlled by these method. As a result, resistance to electromigration can be increased.

As has been described in the foregoing, when a metal wiring is formed by the use of copper, aluminum, or the like, the grain size of metal grains which make up the metal wiring is controlled. The grain size of metal grains especially in an area in which there is the strongest tendency for metals atoms to move because of electromigration is made relatively small compared with that of metal grains in the other areas. By doing so, the number of electrons which flow through that area is reduced and resistance to electromigration is increased. In addition, the metal wiring having the above structure can stably be formed by setting optimum electroplating and sputtering conditions. As a result, a semiconductor device including highly reliable metal wirings having resistance to electromigration can stably be manufactured.

In the present invention a metal wiring in which the resistance of an upper portion is higher than that of central portion is formed. This makes it easier for an electric current to run through the central portion of the metal wiring than to run through the upper portion of the metal wiring. As a result, electromigration from the upper portion is suppressed. Accordingly, a semiconductor device including highly reliable metal wirings can be realized. Furthermore, a metal wiring having the above structure can stably be formed without complicating a process. Therefore, semiconductor devices including highly reliable metal wirings can stably be mass-produced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device including a metal wiring, a top of the metal wiring being covered with a film, resistance of an upper portion of the metal wiring near an interface between the film and the metal wiring being higher than resistance of a central portion of the metal wiring, wherein the top and a bottom of the metal wiring are covered with refractory metal films;

sides of the metal wiring are covered with an insulating film; and average grain size of metal grains in the upper portion of the metal wiring is smaller than average grain size of metal grains in the central portion of the metal wiring.

2. The semiconductor device according to claim 1, wherein resistance of a lower portion of the metal wiring near an interface between a film which covers the bottom of the metal wiring and the metal wiring is higher than the resistance of the central portion of the metal wiring.

3. A semiconductor device including a metal wiring, a top of the metal wiring being covered with a film, resistance of an upper portion of the metal wiring near an interface between the film and the metal wiring being higher than resistance of a central portion of the metal wiring, wherein the top and a bottom of the metal wiring are covered with refractory metal films;

sides of the metal wiring are covered with an insulating film; and the upper portion of the metal wiring is made amorphous.

4. The semiconductor device according to claim 3, wherein resistance of a lower portion of the metal wiring near an interface between a film which covers the bottom of the metal wiring and the metal wiring is higher than the resistance of the central portion of the metal wiring.

* * * * *